(12) United States Patent
Qiu et al.

(10) Patent No.: US 8,836,337 B2
(45) Date of Patent: Sep. 16, 2014

(54) ORGANIC ELECTROLUMINESCENCE DEVICE AND TESTING METHOD THEREOF

(75) Inventors: Yong Qiu, Beijing (CN); Zhaoji Peng, Beijing (CN); Xinyi Zhong, Beijing (CN); Jian Sun, Beijing (CN)

(73) Assignees: Beijing Visionox Technology Co., Ltd., Beijing (CN); Kunshan Visionox Display Co., Ltd., Jiangsu (CN); Tsinghua University, Beijing (CN)

( * ) Notice: Subject to any disclaimer, the term of this patent is extended or adjusted under 35 U.S.C. 154(b) by 228 days.

(21) Appl. No.: 13/375,688
(22) PCT Filed: Dec. 30, 2009
(86) PCT No.: PCT/CN2009/076257
§ 371 (c)(1), (2), (4) Date: Dec. 1, 2011
(87) PCT Pub. No.: WO2010/139175
PCT Pub. Date: Dec. 9, 2010

(65) Prior Publication Data
US 2012/0092017 A1 Apr. 19, 2012

(30) Foreign Application Priority Data
Jun. 5, 2009 (CN) .......................... 2009 1 0084979

(51) Int. Cl.
*G01R 31/00* (2006.01)
*H01L 51/00* (2006.01)
*G02F 3/00* (2006.01)
*H01L 27/32* (2006.01)
*H05B 33/08* (2006.01)
*H01L 51/56* (2006.01)

(52) U.S. Cl.
CPC ............ *H05B 33/0896* (2013.01); *H01L 51/00* (2013.01); *G02F 3/00* (2013.01); *H01L 51/56* (2013.01); *H01L 27/3288* (2013.01); *H01L 51/0031* (2013.01)
USPC ........................ 324/414; 324/760.01; 349/149

(58) Field of Classification Search
CPC . H01L 2031/00; H01L 2051/00; H01L 51/00; G02F 3/00
USPC .............................. 324/414, 760.01; 349/149
See application file for complete search history.

(56) References Cited

U.S. PATENT DOCUMENTS 6,300,997 B1  10/2001  Saito et al.
6,545,424 B2 *  4/2003  Ozawa ........................ 315/169.3
(Continued)

FOREIGN PATENT DOCUMENTS

CN        1362464       8/2002
CN        1435893       8/2003
(Continued)

OTHER PUBLICATIONS

International Preliminary Report on Patentability for International (PCT) Patent Application No. PCT/CN2009/076257, mailed Dec. 15, 2011.

(Continued)

*Primary Examiner* — Huy Q Phan
*Assistant Examiner* — Temilade S Rhodes-Vivour
(74) *Attorney, Agent, or Firm* — Sheridan Ross P.C.

(57) ABSTRACT

An organic electroluminescence device is provided, which comprises: a lighting region, a wiring region, a bonding region and a wiring extending region (300), the lighting region comprises an anode, an organic functional layer, a cathode; the wiring region comprises wirings connecting the anode and cathode with a driving chip or a circuit board; the bonding region is a region in which the wirings connect with the driving chip or the circuit board; the ends of the wirings locate in the wiring extending region, the wirings in the wiring extending region are parallel with the wirings in the wiring region or form an angle with the wirings in the wiring region. A method for testing the organic electroluminescence device is also provided. With improving the wiring arrangement of the organic electroluminescence device, it is easier and more accurate to press bond a conductive adhesive tape and the wirings, and, the row wirings and the column wirings are protected from being shorted during screen testing.

17 Claims, 6 Drawing Sheets

(56) References Cited

U.S. PATENT DOCUMENTS

| | | | |
|---|---|---|---|
| 6,847,343 B2* | 1/2005 | Anzai | 345/90 |
| 7,978,297 B2* | 7/2011 | Kimura et al. | 349/152 |
| 2004/0150765 A1 | 8/2004 | Ueda et al. | |
| 2005/0116658 A1 | 6/2005 | Kato | |
| 2006/0017373 A1 | 1/2006 | Lee | |
| 2006/0232197 A1 | 10/2006 | Lee | |
| 2006/0243968 A1 | 11/2006 | Chang Chien et al. | |
| 2007/0001682 A1* | 1/2007 | Habitz et al. | 324/500 |
| 2007/0051958 A1* | 3/2007 | Yamazaki et al. | 257/72 |
| 2007/0165176 A1 | 7/2007 | Yang et al. | |
| 2007/0262318 A1* | 11/2007 | Shoji et al. | 257/72 |
| 2008/0111473 A1 | 5/2008 | Kawamura et al. | |
| 2008/0284325 A1 | 11/2008 | Noh et al. | |
| 2009/0102364 A1 | 4/2009 | Suh et al. | |
| 2010/0140603 A1 | 6/2010 | Jeong et al. | |
| 2013/0087771 A1 | 4/2013 | Qiu et al. | |

FOREIGN PATENT DOCUMENTS

| | | |
|---|---|---|
| CN | 1512826 | 7/2004 |
| CN | 1527046 A | 9/2004 |
| CN | 1871711 | 11/2006 |
| CN | 1889800 A | 1/2007 |
| CN | 101077971 | 11/2007 |
| CN | 101087759 | 12/2007 |
| CN | 101188247 A | 5/2008 |
| CN | 101221971 A | 7/2008 |
| CN | 101305071 | 11/2008 |
| CN | 101308749 | 11/2008 |
| CN | 101364636 | 2/2009 |
| CN | 101407493 | 4/2009 |
| CN | 101412907 | 4/2009 |
| CN | 101452997 | 6/2009 |
| EP | 1850391 | 10/2007 |
| EP | 2112214 | 10/2009 |
| EP | 2141214 | 1/2010 |
| EP | 2161319 | 3/2010 |
| JP | H07-159483 | 6/1995 |
| JP | 2000-134411 | 5/2000 |
| JP | 2003-066870 | 3/2003 |
| JP | 2004-070137 | 3/2004 |
| JP | 2005-241988 | 9/2005 |
| JP | 2006-173550 | 6/2006 |
| JP | 2006-176448 | 7/2006 |
| JP | 2007-147949 | 6/2007 |
| JP | 2007-298938 | 11/2007 |
| JP | 2008-162921 | 7/2008 |
| JP | 2008-169197 | 7/2008 |
| JP | 2009-173642 | 8/2008 |
| JP | 2009-266927 | 11/2009 |
| KR | 1997-0008537 | 2/1997 |
| KR | 2006-0029086 | 4/2006 |
| KR | 2006-0113552 | 11/2006 |
| KR | 2006-0120328 | 11/2006 |
| KR | 2009-0029111 | 3/2009 |
| KR | 10-2009-0086015 | 8/2009 |
| WO | WO 2009/008351 | 1/2009 |
| WO | WO 2009/054253 | 4/2009 |
| WO | WO 2009/097084 | 8/2009 |
| WO | WO 2009/136596 | 11/2009 |

OTHER PUBLICATIONS

International Search Report prepared by The State Intellectual Property Office, The People's Republic of China, on Apr. 8, 2010, for International Application No. PCT/CN2009/076257.
Official Action (with English translation) for Korean Patent Application No. 10-2011-7025657 dated Nov. 25, 2013, 4 pages.
International Search Report prepared by The The State Intellectual Property Office, the P.R. China, on Sep. 2, 2010, for International Application No. PCT/CN2009/076276.
Office Action dated Sep. 9, 2011, issued by the The State Intellectual Property Office of the People's Republic of China (SIPO) for priority application CN200910234478.X.
Office Action dated Oct. 14, 2011, issued by the The State Intellectual Property Office of the People's Republic of China (SIPO) for priority application CN200910234760.8.
International Preliminary Report on Patentability for International (PCT) Patent Application No. PCT/CN2009/076276, dated May 15, 2012, 6 pages.
Extended European Search Report for European Patent Application No. 09851216.3 dated May 14, 2013, 9 pages.
Official Action (with English translation) for Korean Patent Application No. 10-2012-7004954 dated Aug. 16, 2013, 14 pages.
Burroughes et al. "Light-emitting diodes based on conjugated polymers"; Nature, vol. 347, p. 539, Oct. 11, 1990.
Huang et al. "Low-Work-Function Surface Formed by Solution-Processed and Thermally Deposited Nanoscale Layers of Cesium Carbonate"; Adv. Funct. Mater. 2007, 17, 1966-1973.
JE et al, "Preparation of anthracene compounds as n-type organic semiconductor materials for organicelectroluminescent device," 2009, CAPlus Accession No. 2009:364648, 2 pages. (Abstract only).
Oshiyama et al., "Organicelectroluminescent devices for display and light sources and material for the same," 2009, CAPlus Accession No. 2009:1401952, 2 pages (Abstract only).
Oshiyama et al., "Organicelectroluminescent device, display device and illuminating device," 2009, CAPlus Accession No. 2009:519356, 2 pages. (Abstract only).
Pope et al. "Electroluminescence in Organic Crystals"; Chem. Phys., vol. 38, pp. 2042-2043, 1963.
Takashima, et al., "Benzothiadiazoles, organicelectroluminescent materials containing them, and blue-emitting organic electroluminescent devices using them," 2008, CAPlus Accession No. 2008:856996, 2 pages. (Abstract only).
Tang et al. "Organic electroluminescent diodes"; Appl. Phys. Lett. 51(12), p. 913, Sep. 21, 1987.
Wu et al. "High-efficiency electron injection cathode of Au for polymer light-emitting devices"; Organic Electronics, 2005, 6, 118-128.
Yamamoto et al, "Organicelectroluminescent element," 2009, CAPlus Accession No. 2009:1394448, 2 pages. (Abstract only).
Yang et al. "Conjugated Oligoelectrolyte Electron Transport/Injection Layers for Organic Optoelectronic Devices"; J.Am.Chem.Soc. 2008, 130, 3282-3283.
Extended European Search Report for European Patent Application No. 09845455.6 dated Sep. 17, 2013, 7 pages.

* cited by examiner

US 8,836,337 B2

ORGANIC ELECTROLUMINESCENCE DEVICE AND TESTING METHOD THEREOF

CROSS REFERENCE TO RELATED APPLICATIONS

This application is a national stage application under 35 U.S.C. 371 of PCT Application No. PCT/CN2009/076257 having an international filing date of 30 Dec. 2009, which designated the United States, which PCT application claimed the benefit of Chinese Application No. 200910084979.4 filed 5 Jun. 2009, the entire disclosure of each of which is incorporated herein by reference.

FIELD OF THE INVENTION

The invention relates to an organic electroluminescent device (OLED) and a testing method thereof, particularly, to a wiring design for the OLED.

BACKGROUND OF THE INVENTION

An organic electroluminescent device (OLED) is a flat panel displaying device which emits light by recombination of carriers injected into an organic functional layer from an anode and a cathode. The OLED has properties such as all solid state, self emitting, high contrast, ultra thin thickness, and it is capable of realizing flexible display.

Currently, electronic devices are subjected to processes of testing and aging so as to examine the device performance before they are put into the market. As for different chip bonding technology, different problems occur during the stage of testing and aging. A screen and a chip are bonded by adopting a Chip on glass (COG) manner, as shown in FIGS. 1-1 and 1-2, and the OLED comprises a substrate 103 and a lighting region 102, wherein the lighting region 102 is composed of an anode 1002, an organic functional layer 1003, and a cathode 1004 which are disposed on the substrate 103. A wiring region 101 is provided at the right and left sides and the bottom edge of the lighting region 102, and a bonding region 104 is provided at the bottom edge of the wiring region 101. Odd-number row wirings 101[1] are led from the left side of the lighting region 102, even-number row wirings 101[2] are led from the right side of the lighting region 102; and right column wirings 101[3] and left column wirings 101[4] are led from below the lighting region 102. After the row wirings and the column wirings are led out, they are concentrated at the bonding region 104 with being insulated from each other, and they are bonded at one side (edge) of the substrate, i.e., single edge boding.

For purpose of clear illustration, not all the row and column wirings are shown. Because the gap between the wirings on the COG product screen is too small, narrower conductive glue strip should be used for the too narrower space, so that (1) the conductive glue strip is likely offset so as to lead to short circuit of the screen; (2) the service life of the conductive glue strip is reduced; and (3) the wirings are broken when the conductive glue strip are press bonded with the wirings. When the gap is smaller than the minimum alignment accuracy which can be achieved in the testing and aging processes, the screen can not be lit in a short bar manner and the testing and aging can not be performed on the screen. The defective product can only be found after it is bonded with a driving chip. Currently, the screen testing and aging process can not be performed on this sort of products so that it is difficult to ensure a high yield.

The wirings of the OLED is fabricated by using a photolithography process, the important process conditions comprise etching temperature, speed, duration, etching agent concentration and the like. Over-etching will likely occur if any of the parameters is not well controlled. If there is no wiring extending region, the ends of the wirings are bonded with the driving chip. The over-etched wirings are shorter than a desired length needed for bonding, and these over-etched wirings can not be contacted with the respective chip pins or badly contacted with them, so that the corresponding rows or columns in the lighting region can not be lit. As shown in FIG. 2-1, a left column wiring 201 and a right column wiring 202 are over-etched to a length shorter than the desired length needed for bonding so that they can not be contacted with the chip pins. If the bonding position is shift upward, as shown in FIG. 2-2, so that the left column wiring 201 and the right column wiring 202 can be bonded normally. However, in this case, the chip pins will reach the bending positions of the left column wiring 203 and the right column wiring 204, and the left column wiring 203 and the right column wiring 204 can not be connected with the corresponding chip pins correctly.

SUMMARY OF THE INVENTION

The present invention provides a wiring design for an OLED which can ensure the testing effect while performing testing.

The aim of the invention is achieved by the following solutions:

An organic electroluminescent device, comprising a lighting region, a wiring region, and a bonding region, the lighting region comprises an anode, an organic functional layer, and a cathode; the wiring region is composed of wirings connecting the anode and the cathode with a driving chip or a circuit board; the bonding region is a region in which the wirings are bonded with the driving chip or the circuit board; the device further comprises a wiring extending region, in which ends of the wirings are located; an angle formed by the wirings in the wiring extending region and the wirings in the wiring region is larger than 0° and less than 90°.

The angle formed by the wirings in the wiring extending region and the wirings in the wiring region is larger than 20° and less than 80°, preferably, it is 30°, 45°, 60° or 75°.

When the wirings are bonded in a single edge, the wirings comprises odd-number row wirings, even-number row wirings, left column wirings, and right column wirings, the column wirings are disposed at the middle, and the odd-number and even number row wirings are respectively disposed at one of the both sides of the column wirings. When the left column wirings and the right column wirings extend toward directions departing away from each other, the odd-number row wirings and the odd-number row wirings may extend toward directions facing each other or extend toward directions departing away from each other, and all of the row and column wirings are not intercrossed with each other. Also, when the left column wirings and the right column wirings extend toward directions facing each other, the odd-number row wirings and the odd-number row wirings may extend toward directions facing each other or extend toward directions departing away from each other, and all of the row and column wirings are not intercrossed with each other. In addition, the angles of the extending portions of these odd-number row wirings, even-number row wirings, left column wirings, and right column wirings may be different.

The number of the wirings in the wiring extending region may be less than that in the wiring region. That is to say, when the wirings extend in the wiring extending region by an certain angle from the vertical direction, a part of the ends of the wirings may be located in the bonding region and do not extend into the wiring extending region, so as to ensure all of the row and column wirings are not intercrossed with each other.

The length of the wirings in the wiring extending region is preferably 0.1 mm-0.5 mm.

Another aim of the invention is to provide a testing method for an OLED.

The aim of the invention is achieved by the following solutions:

A testing method for the organic electroluminescent device as described above, the testing method comprises the following steps: (1) shorting the row wirings to be lit, and shorting the column wirings to be lit; (2) applying a lighting voltage to the row or column wirings shorted in the step (1); and (3) obtaining the testing result according to the testing situation.

In the step (1), all of the odd-number row wirings may be shorted, all of the even-number row wirings may be shorted, and all of the column wirings may be shorted. Or, in the step (1), all of the row wirings may be shorted, and all of the column wirings may be shorted.

The wirings to be shorted are connected by using a conductive material in the step (1), and the conductive material is a metal film or a conductive glue strip.

The invention extends the row wirings and the column wirings along directions departing away from each other or along direction facing each other by changing the wiring arrangement for the OLED: (1) Because the row wirings and column wirings are connected with the anode and the cathode, respectively, the row wirings can not be connected with the column wirings. The wiring design for the present invention enlarges the space between the row wirings and the column wirings so that the short circuit between the row and column wirings is avoided in the screen testing stage. (2) The row and column wirings are inclined by a certain angle, and the extending length of the wrings may be longer in the extending region with limited area compared with the case without inclination, which increases the contact area with the conductive glue strips and reduces the current load shared by per unit area conductive medium, so that the service life of the conductive glue strips is improved. (3) The widths in the horizontal direction of the row and column wirings are increased, which can meet the requirement by the minimum alignment accuracy for the current testing and aging equipment, so that the conductive glue strips may be press bonded with the wrings much easier and more accurately.

The corresponding testing method can be used for the aging and testing for the OLED, which ensures a high yield.

In addition, because the ends of the wirings are located within the wiring extending region and the bonding is not performed at the ends of the wirings, the wiring ends are not used even the over-etching phenomenon occurs when the wirings are over etched. Therefore, a well contact between the wirings and the chip pins is ensured and no additional process steps are needed for this wirings structure.

BRIEF DESCRIPTION OF THE DRAWING

FIG. 1-2 is a cross-sectional view of the organic electroluminescent displaying screen taken along a longitudinal direction;

FIG. 2-1 is a schematic view showing bonding for wirings after being etched in the prior art;

FIG. 2-2 is a schematic view showing a case in which a bonding region for wirings after being etched is shift upward;

101—wiring region; 102—lighting region; 103—substrate; 104, 205—bonding region; 1002—anode electrode; 1003—organic functional layer; 1004—cathode electrode; 300, 500, 700, 800—wiring extending region; 402, 403, 404—conductive glue strip crimping region; 101[1], 401[1], 501[1], 701[1], 801[1]—odd-number row wiring; 101[2], 401[2], 501[2], 701[2], 801[2]—even-number row wiring; 101[3], 401[3], 501[3], 701[3], 801[3], 201, 203, 601—left column wiring; 101[4], 401[4], 501[4], 701[4], 801[4], 202, 204, 602—right column wiring.

DESCRIPTION OF THE PREFERRED EMBODIMENTS

In the invention, a direction from a substrate to a cathode is taken as a longitudinal direction, and a direction perpendicular to the longitudinal direction is taken as a transverse direction. It should be noted that a wiring region, a bonding region and a wiring extending region are defined in purpose of convenience for description, which by no means shows that the wirings in these regions are independent from each other. These wirings, as a whole, are formed by photolithography process, wherein the portions between a lighting region and a bonding region constitute the wiring region; the portions between the bonding region and a lower edge of a substrate constitute the wiring extending region.

The technology according to the invention adopts a new mask so that patterns of the wirings formed by photolithography are different from those in the prior art.

A manufacturing process for OLED generally comprises the following steps:

(1) A layer of electrode material, which is generally composed of a transparent material such as indium tin oxide (ITO) or Tin Zinc oxide, is sputtered on a glass substrate, and ITO patterns including a portion of anode of the OLED and a portion of electrode wirings are formed by photolithography. If the wirings are too long or too slim, a relatively large voltage drop will occur across the wirings so that the luminous intensity will decrease. In order to reduce the resistance as can as possible, chromium is generally added onto the ITO as wirings. Therefore, the electrode wirings generally comprise two layers of ITO and chromium.

(2) An insulating layer and a spacing column are fabricated by a photolithography method which is a necessary procedure for realizing RGB colors and can space different pixels to achieve a pixel array.

(3) An organic light emitting material is deposited by a vacuum evaporation method to from an organic functional layer which comprises a hole injection layer, a hole transport layer, a light emitting layer, a electron transport layer, and the like.

(4) A cathode material is applied by a vacuum evaporation method.

(5) A glass substrate with grooves and attached with a dry shift is laminated on an OLED substrate so as to realize a package which can reduce damage on the device due to components such as water and oxygen.

Figure 1:
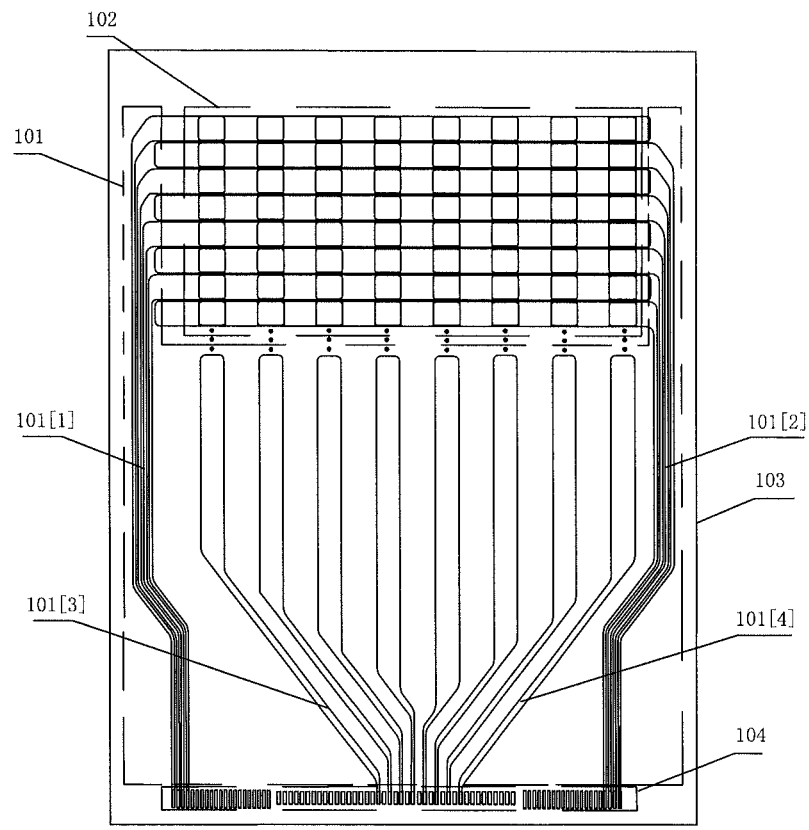
FIG. 1-1 is a schematic view of an organic electroluminescent displaying screen.
Figures 1, 2:
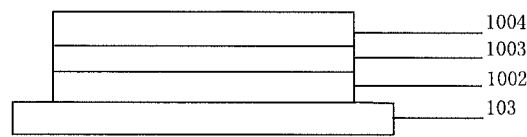
Figures 1, 2:
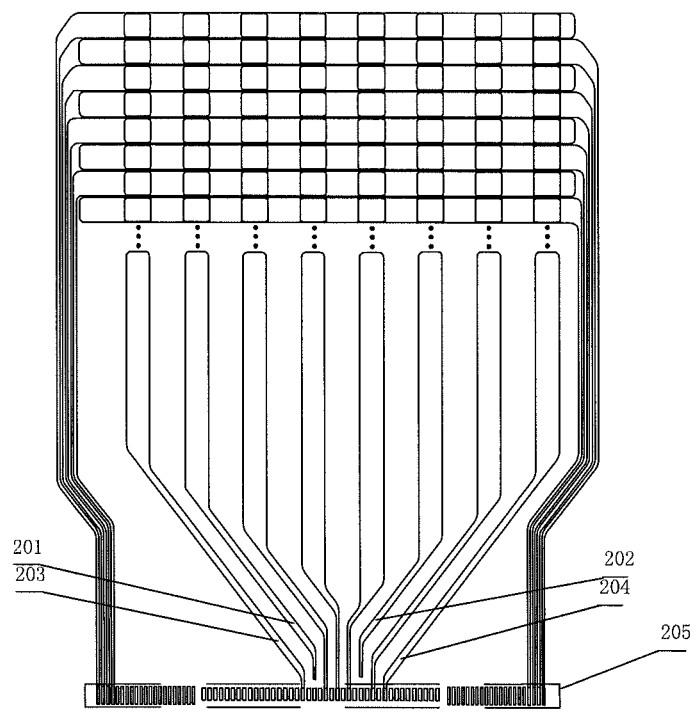
Figure 2:
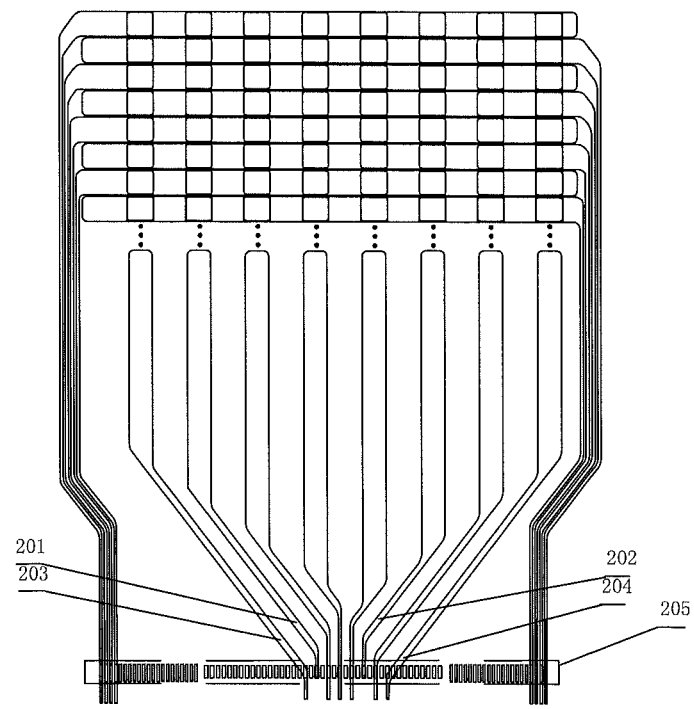

(6) The electrode wirings are bonded with a driving chip or a circuit board to realize a connection between the lighting region and the driving chip or the circuit. The bonding manner for the wirings and the chip may be realized in the following ways: single edge bonding, i.e., arranging all of the row and column wirings to an edge of the substrate and connecting them with one chip, as shown in FIG. 1-1; bi-edge bonding, i.e., arranging the row wirings to a edge of the substrate and the column wirings to another edge, then connecting each of them with one chip respectively. The single edge bonding is generally used because the space on the edges of the devices can be saved and the number of chips can be reduced.

Hereinafter, the invention will be described in further detail by connection with embodiments and drawings.

First Embodiment

Figure 3:
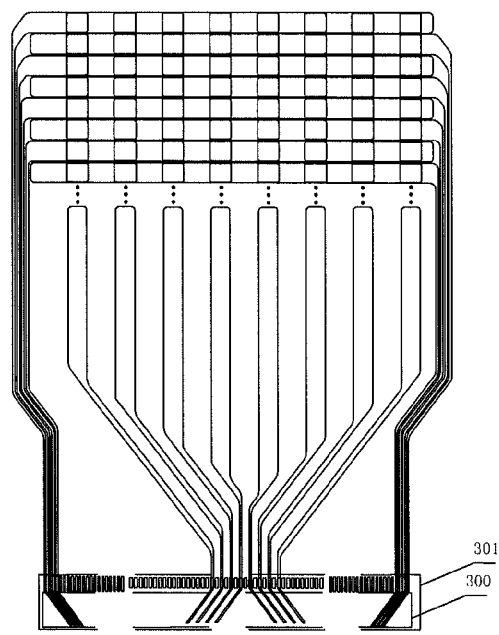
FIG. 3 is a schematic view showing bonding according to a first embodiment of the invention.
Figure 4:
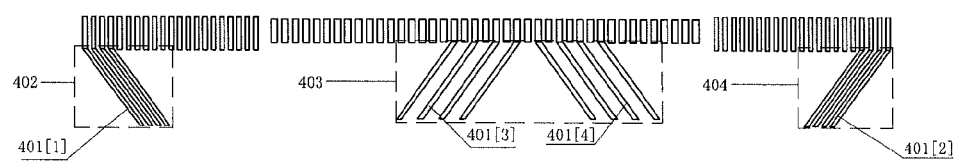
FIG. 4 is an enlarged view of the region denoted by "301" in FIG. 3.

As shown in FIGS. 3 and 4, the first embodiment is an organic electroluminescent device with 96 rows and 16 columns.

From a lighting region, odd-number row wirings 401[1] and even-number row wirings 401[2] are led transversely, and left column wirings 401[3] and right column wirings 401[4] are led longitudinally. Ends of the wirings are located at a wiring extending region 300. After the left column wirings 401[3] are bonded with the chip pins, the ends thereof go beyond the chip pins and extend toward the left side by an angle of 30° from the vertical direction; after the right column wirings 401[4] are bonded with the chip pins, the ends thereof go beyond the chip pins and extend toward the right side by an angle of 30° from the vertical direction; after the odd-number row wirings 401[1] are bonded with the chip pins, the ends thereof go beyond the chip pins and extend toward the right side by an angle of 30° from the vertical direction; after the even-number row wirings 401[2] are bonded with the chip pins, the ends thereof go beyond the chip pins and extend toward the left side by an angle of 30° from the vertical direction. The length of the wirings in the wiring extending region is 0.4 mm. The odd-number row wirings 401[1], the even-number row wirings 401[2], the left wirings 401[3], and the right column wirings 401[4] are not intercrossed with each other.

The manufacturing process of the organic electroluminescent device comprises the following steps:

(1) Putting a glass substrate being cleaned and dried into a photolithography equipment, wherein a ITO layer and a metal chromium layer thereon have been formed on the glass substrate.

(2) Applying a photoresist layer on the ITO and chromium layers by a spin method and baking it.

(3) Covering a mask on the photoresist and exposing the photoresist by illuminating the surface of the photoresist through the mask with UV light.

(4) Developing the photoresist and hardening it.

(5) Etching. The etching agents for the ITO and the chromium may be different, and are a mixed etching liquid of water, hydrochloric acid and nitric acid with a ratio of 10:10:1 and a mixed etching liquid of water, ammonium cerium nitrate and a nitric acid with a ratio of 10:2:1.

The etched wiring patterns are shown in FIG. 3. After the etching, an organic functional layer and a cathode are fabricated in an evaporation chamber, and then a package cover attaching procedure is performed in a isolated chamber. The substrate after the package step is taken out and a testing procedure prior to bonding is started. The short circuit between the wirings in each portion is realized by a conductive glue strip, and the frames 402, 403, 404 in FIG. 4 are conductive glue strip crimping regions. The conductive glue strip in 402 electrically connects all the odd-number row wirings 401[1] on the screen, the conductive glue strip in 403 electrically connects all the column wirings 401[3] and 401[4] on the screen, and the conductive glue strip in 404 electrically connects all the even-number row wirings 401[2] on the screen, and the conductive glue strips in the three locations are spaced by 1.6 mm from each other, which is much larger than the minimum alignment accuracy of the testing device, 0.8 mm. Therefore, the testing can be operated effectively. The conductive pads on the PCB of the testing device are electrically connected with the conductive glue strips in the three locations, respectively, and the full screen lighting result for the screen is tested and recorded. After the testing is over, the conductive glue strips in the three locations are lifted off and the screen is shifted into the next stage for bonding with the driving chip.

Second Embodiment

Figure 5:
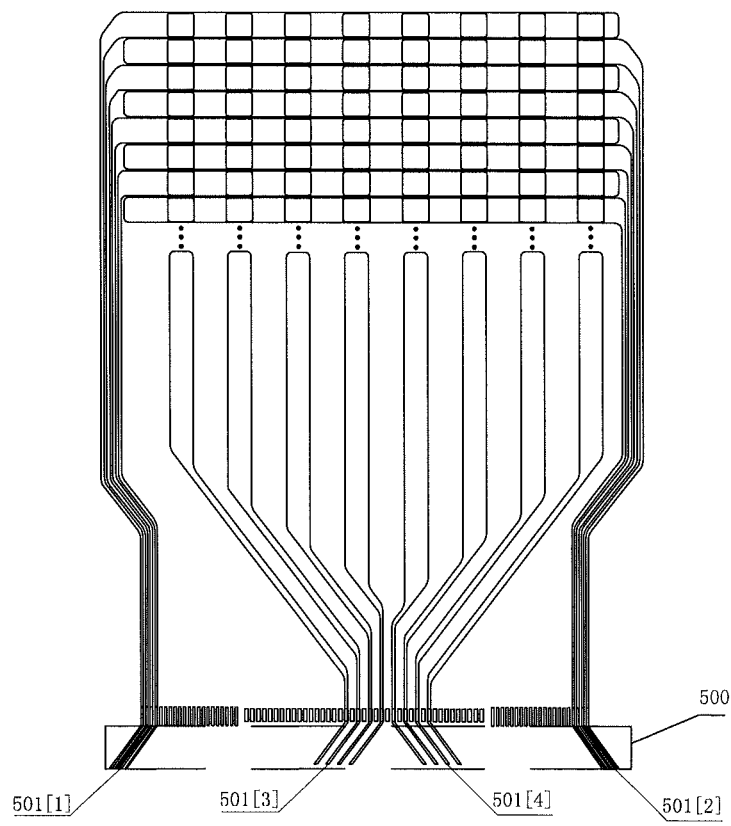
FIG. 5 is a schematic view showing bonding according to a second embodiment of the invention.

As shown in FIG. 5, the second embodiment is also an organic electroluminescent device with 96 rows and 16 columns. From a lighting region, odd-number row wirings 501[1] and even-number row wirings 501[2] are led transversely, and left column wirings 501[3] and right column wirings 501[4] are led longitudinally. Ends of the wirings are located at a wiring extending region 500. After the left column wirings 501[3] are bonded with the chip pins, the ends thereof go beyond the chip pins and extend toward the left side by an angle of 45° from the vertical direction; after the right column wirings 501[4] are bonded with the chip pins, the ends thereof go beyond the chip pins and extend toward the right side by an angle of 45° from the vertical direction; after the odd-number row wirings 501[1] are bonded with the chip pins, the ends thereof go beyond the chip pins and extend toward the left side by an angle of 45° from the vertical direction; after the even-number row wirings 501[2] are bonded with the chip pins, the ends thereof go beyond the chip pins and extend toward the right side by an angle of 45° from the vertical direction. The length of the wirings in the wiring extending region is 0.5 mm. The odd-number row wirings 501[1], the even-number row wirings 501[2], the left wirings 501[3], and the right column wirings 501[4] are not intercrossed with each other.

The manufacturing process of the organic electroluminescent device is the same as that in the first embodiment, which will not be described repeatedly.

After the etching, an organic functional layer and a cathode are fabricated in an evaporation chamber, and then a package cover attaching procedure is performed in a isolated chamber. The substrate after the package step is taken out and a testing procedure prior to bonding is started, and the testing steps are the same as those in the first embodiment. The short circuit between the wirings in each portion is realized by a zebra strip, and the wiring extending region 500 in FIG. 5 is the attaching location for the zebra strip. After the testing is over, the zebra strip is lifted off and the screen is shifted into the next stage for bonding with the driving chip.

Third Embodiment

Figure 6:
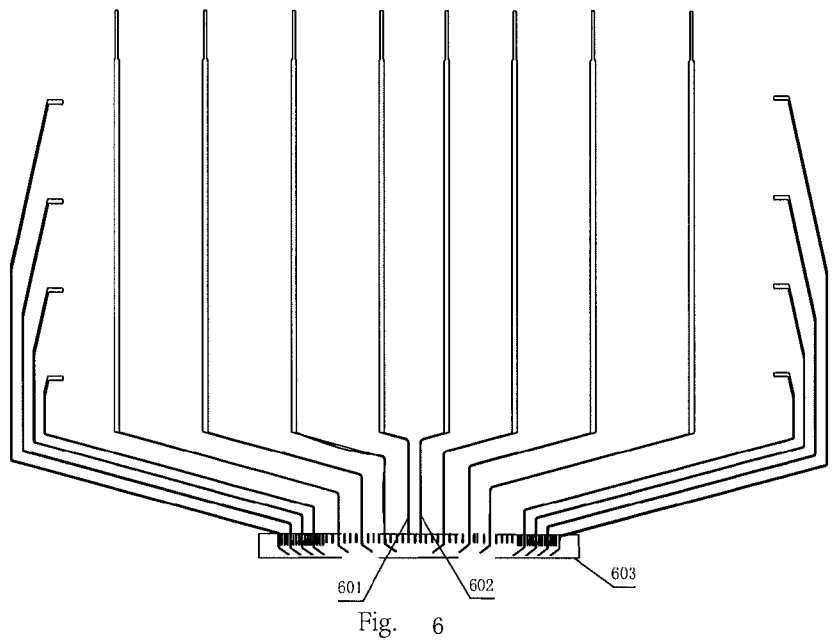
FIG. 6 is a schematic view showing bonding according to a third embodiment of the invention.
Figure 7:
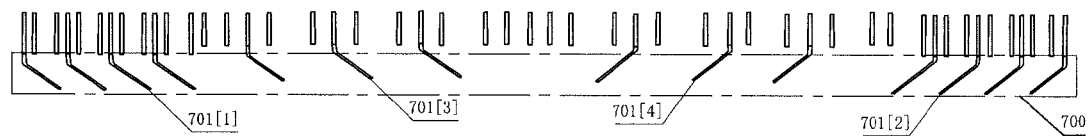
FIG. 7 is an enlarged view of the region denoted by "603" in FIG. 6.

As shown in FIGS. 6 and 7, the third embodiment is an organic electroluminescent device with 64 rows and 128 columns. From a lighting region, odd-number row wirings 701[1] and even-number row wirings 701[2] are led transversely, and left column wirings 701[3] and right column wirings 701[4] are led longitudinally. Ends of the wirings are located at a wiring extending region 700. After the left column wirings 701[3] are bonded with the chip pins, the ends thereof go beyond the chip pins and extend toward the right side by an angle of 60° from the vertical direction; after the right column wirings 701[4] are bonded with the chip pins, the ends thereof go beyond the chip pins and extend toward the left side by an angle of 60° from the vertical direction; after the odd-number row wirings 701[1] are bonded with the chip pins, the ends thereof go beyond the chip pins and extend toward the right side by an angle of 60° from the vertical direction; after the even-number row wirings 701[2] are bonded with the chip pins, the ends thereof go beyond the chip pins and extend toward the left side by an angle of 60° from the vertical direction. The length of the wirings in the wiring extending region is 0.1 mm. The odd-number row wirings 701[1], the even-number row wirings 701[2], the left wirings 701[3], and the right column wirings 701[4] are not intercrossed with each other.

The manufacturing process of the organic electroluminescent device is the same as that in the first embodiment, which will not be described repeatedly.

One wiring 601 among the left column wirings and one wiring 602 among the right column wirings are adjacent wirings. If they extend toward the right side and the left side, respectively, after going beyond the chip, then they may be intercrossed with each other. Therefore, in order to avoid the ends of the left column wiring 601 and the right column wiring 602 are intercrossed with each other, the ends are located within the bonding region. That is to say, these two wirings do not extends to the wiring extending region after bonded with the chip pins.

The testing procedure is the same as that in the first embodiment, which will not be described repeatedly.

Fourth Embodiment

Figure 8:
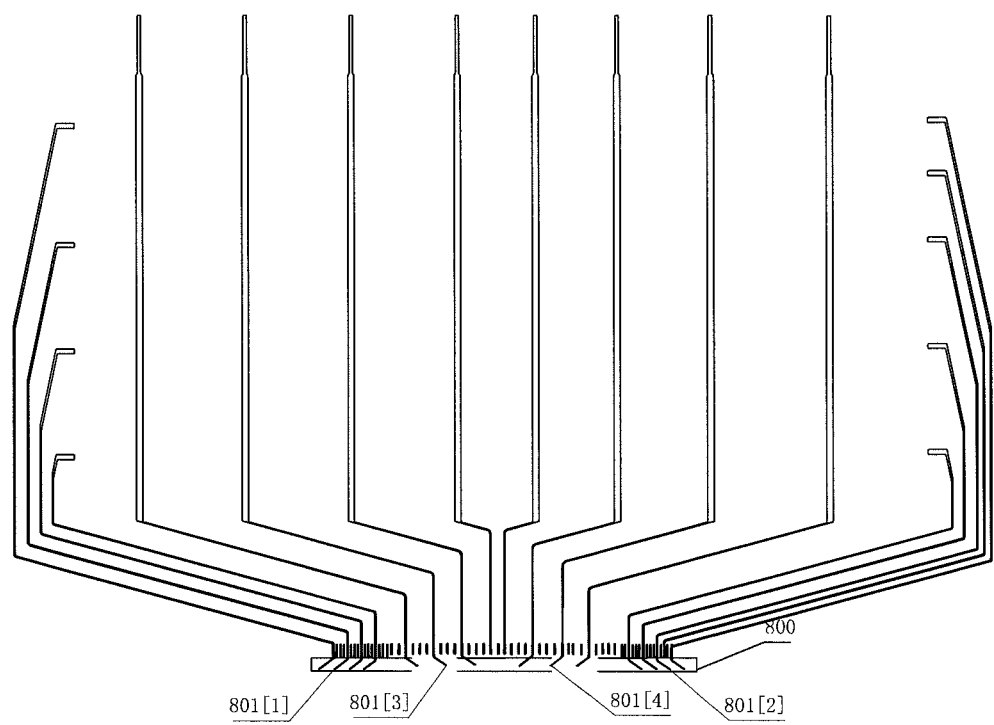
FIG. 8 is a schematic view showing bonding according to a fourth embodiment of the invention.

As shown in FIG. 8, the fourth embodiment is also an organic electroluminescent device with 64 rows and 128 columns. From a lighting region, odd-number row wirings 801[1] and even-number row wirings 801[2] are led transversely, and left column wirings 801[3] and right column wirings 801[4] are led longitudinally. Ends of the wirings are located at a wiring extending region 800. After the left column wirings 801[3] are bonded with the chip pins, the ends thereof go beyond the chip pins and extend toward the right side by an angle of 75° from the vertical direction; after the right column wirings 801[4] are bonded with the chip pins, the ends thereof go beyond the chip pins and extend toward the left side by an angle of 75° from the vertical direction; after the odd-number row wirings 801[1] are bonded with the chip pins, the ends thereof go beyond the chip pins and extend toward the left side by an angle of 75° from the vertical direction; after the even-number row wirings 801[2] are bonded with the chip pins, the ends thereof go beyond the chip pins and extend toward the right side by an angle of 75° from the vertical direction. The length of the wirings in the wiring extending region is 0.2 mm. The odd-number row wirings 801[1], the even-number row wirings 801[2], the left wirings 801[3], and the right column wirings 801[4] are not intercrossed with each other.

The manufacturing process of the organic electroluminescent device and the testing procedure are the same as those in the first embodiment, which will not be described repeatedly.

The photolithography steps for the second, third and fourth embodiments are the same as those for the first embodiment. However, the mask used for the photolithography will be different due to the different patterns of the wirings.

As for the wiring structure in the first to fourth embodiments, the present invention adopts new masks for the photolithography process so as to form wiring patterns in which the row wirings and the column wirings extend along directions departing away from each other or along opposed direction, which is different from those in the prior art. The wiring design for the present invention enlarges the space between the row wirings and the column wirings so that the short circuit between the row and column wirings is avoided in the screen testing stage. The row and column wirings are inclined by a certain angle, which increases the contact area with the conductive glue strips and reduces the current load shared by per unit area conductive medium, so that the service life of the conductive glue strips is improved.

By using the wiring structure and testing method according to the first to fourth embodiments of the invention, the inventor performed testing and aging processes on the COG product successfully with the current testing and aging equipments, so that a high yield is ensured.

In addition, because the ends of the wirings are located within the wiring extending region and the bonding is not performed at the ends of the wirings, the wiring ends are not used even the over-etching phenomenon occurs when the wirings are over etched. Therefore, a well contact between the wirings and the chip pins is ensured and no additional process steps are needed for this wirings structure.

The invention is thus described with the preferred embodiments, but such embodiments are not to be regarded as the limitation of the invention. It should be understand by those skilled in the art that various alternations or modifications may occur insofar as they are within the spirit and scope of the invention; therefore, the protection scope of the invention should be defined by the appended claims or the equivalents thereof.

What is claimed is:

1. An organic electroluminescent device, comprising:
   a lighting region, a wiring region, a bonding region, and a wiring extending region formed on a substrate;
   the lighting region comprises an anode, an organic functional layer, and a cathode;
   the wiring region comprises wirings connecting the anode and the cathode with a driving chip or a circuit board;
   the bonding region is a region in which the wirings are bonded with the driving chip or the circuit board;
   the wiring extending region is a region in which ends of the wirings are located;
   wherein a portion between the lighting region and the bonding region constitutes the wiring region;
   wherein a portion between the bonding region and the lower edge of the substrate constitutes the wiring extending region;
   wherein the wirings in the wiring region, the bonding region and the wiring extending region, as a whole, are formed on the substrate by a photolithography process; and
   wherein, an angle formed by the wirings in the wiring extending region and the wirings in the wiring region is larger than 0° and less than 90°.

2. The organic electroluminescent device of claim 1, wherein, the angle formed by the wirings in the wiring extending region and the wirings in the wiring region is larger than 20° and less than 80°.

3. The organic electroluminescent device of claim 1, wherein, the angle formed by the wirings in the wiring extending region and the wirings in the wiring region is 30°, 45°, 60° or 75°.

4. The organic electroluminescent device of claim 1, wherein, the wirings are bonded in a single edge, the wirings comprises odd-number row wirings, even-number row wirings, left column wirings, and right column wirings, the column wirings are disposed at the middle, and the odd-number and even number row wirings are respectively disposed at one of the both sides of the column wirings.

5. The organic electroluminescent device of claim 4, wherein, the left column wirings and the right column wirings in the wiring extending region extend toward directions departing away from each other and are not intercrossed with each other.

6. The organic electroluminescent device of claim 5, wherein, the odd-number row wirings and the odd-number row wirings in the wiring extending region extend toward directions facing each other, and the left column wirings, the right column wirings, and the odd-number row wirings and the even-number row wirings are not intercrossed with each other.

7. The organic electroluminescent device of claim 5, wherein, the odd-number row wirings and the even-number row wirings in the wiring extending region extend toward directions departing away from each other, and the left column wirings, the right column wirings, and the odd-number row wirings and the even-number row wirings are not intercrossed with each other.

8. The organic electroluminescent device of claim 4, wherein, the left column wirings and the right column wirings in the wiring extending region extend toward directions facing each other, and are not intercrossed with each other.

9. The organic electroluminescent device of claim 8, wherein, the odd-number row wirings and the even-number row wirings in the wiring extending region extend toward directions facing each other, and the left column wirings, the right column wirings, and the odd-number row wirings and the even-number row wirings are not intercrossed with each other.

10. The organic electroluminescent device of claim 8, wherein, the odd-number row wirings and the odd-number row wirings in the wiring extending region extend toward directions departing away from each other, and the left column wirings, the right column wirings, and the odd-number row wirings and the even-number row wirings are not intercrossed with each other.

11. The organic electroluminescent device of claim 1, wherein, the number of the wirings in the wiring extending region is less than that in the wiring region.

12. An organic electroluminescent device, comprising:
a lighting region comprising an anode, an organic functional layer, and a cathode;
a wiring region comprising wirings connecting the anode and the cathode with a driving chip or a circuit board;
a boding region comprising a region in which the wirings are bonded with the driving chip or the circuit board;
a wiring extending region comprising a region in which ends of the wirings are located;
wherein a portion between the lighting region and the bonding region constitutes the wiring region;
wherein a portion between the bonding region and a lower edge of the substrate constitutes the wiring extending region;
wherein the wirings in the wiring region, the bonding region and the wiring extending region, as a whole, are formed on a substrate by a photolithography process;
wherein, an angle formed by the wirings in the wiring extending region and the wirings in the wiring region is larger than 0° and less than 90°, and
wherein the length of the wirings in the wiring extending region is 0.1 mm-0.5 mm.

13. A testing method for an organic electroluminescent device, comprising:
a lighting region, a wiring region, a bonding region and a wiring extending region;
the lighting region comprising an anode, an organic functional layer, and a cathode;
the wiring region comprising wirings connecting the anode and the cathode with a driving chip or a circuit board;
the bonding region comprising a region in which the wirings are bonded with the driving chip or the circuit board;
a wiring extending region, in which ends of the wirings are located;
wherein, an angle formed by the wirings in the wiring extending region and the wirings in the wiring region is larger than 0° and less than 90°;
wherein the wirings in the wiring region, the bonding region and the wiring extending region, as a whole, are formed on a substrate by a photolithography process;
wherein a portion between the lighting region and the bonding region constitutes the wiring region;
wherein a portion between the bonding region and a lower edge of the substrate constitutes the wiring extending region, and
wherein the testing method comprises the following steps:
a) shorting the row wirings to be lit, and shorting the column wirings to be lit;
b) applying a lighting voltage to the row or column wirings shorted in the step a);
c) obtaining the testing result according to the testing situation.

14. The testing method for the organic electroluminescent device of claim 13, wherein, in the step a), all of the odd-number row wirings are shorted, all of the even-number row wirings are shorted, and all of the column wirings are shorted.

15. The testing method for the organic electroluminescent device of claim 13, wherein, in the step a), all of the row wirings are shorted, and all of the column wirings are shorted.

16. The testing method for the organic electroluminescent device of claim 13, wherein, the wirings to be shorted are connected by using a conductive material in the step a).

17. The testing method for the organic electroluminescent device of claim 16, wherein, the conductive material is a metal film or a conductive glue strip.

* * * * *